United States Patent
Shringarpure et al.

(10) Patent No.: US 9,826,291 B2
(45) Date of Patent: Nov. 21, 2017

(54) LOW DISTORTION SINGLE-TO-DIFFERENTIAL WIDE-BAND VARIABLE GAIN AMPLIFIER FOR OPTICAL COMMUNICATIONS

(71) Applicant: Avago Technologies General IP (Singapore) Pte. Ltd., Singapore (SG)

(72) Inventors: Rahul Shringarpure, San Jose, CA (US); Chakravartula Nallani, San Jose, CA (US); Georgios Asmanis, Lake Forest, CA (US); Faouzi Chaahoub, San Jose, CA (US)

(73) Assignee: AVAGO TECHNOLOGIES GENERAL IP (SINGAPORE) PTE. LTD., Singapore (SG)

( * ) Notice: Subject to any disclaimer, the term of this patent is extended or adjusted under 35 U.S.C. 154(b) by 94 days.

(21) Appl. No.: 14/879,598

(22) Filed: Oct. 9, 2015

(65) Prior Publication Data

US 2017/0105059 A1    Apr. 13, 2017

(51) Int. Cl.
| | | |
|---|---|---|
| *H04J 14/00* | (2006.01) | |
| *H04Q 11/00* | (2006.01) | |
| *H03F 1/02* | (2006.01) | |
| *H03F 17/00* | (2006.01) | |
| *H04L 27/00* | (2006.01) | |
| *H03F 3/08* | (2006.01) | |

(52) U.S. Cl.
CPC ....... *H04Q 11/0005* (2013.01); *H03F 1/0205* (2013.01); *H03F 3/08* (2013.01); *H03F 17/00* (2013.01); *H04L 27/0002* (2013.01); *H03F 2200/324* (2013.01); *H04Q 2011/0013* (2013.01)

(58) Field of Classification Search
CPC .......... H03F 3/45183; H03F 2200/372; H03F 2203/45288; H03F 2200/555; H03F 3/45; G05F 1/575; G05F 1/573
USPC .......................................................... 398/45
See application file for complete search history.

(56) References Cited

U.S. PATENT DOCUMENTS

| | | | |
|---|---|---|---|
| 8,134,410 B1 | 3/2012 | Zortea | |
| 2004/0183599 A1 | 9/2004 | Banba et al. | |
| 2006/0097788 A1* | 5/2006 | Yang | H03F 3/45251 330/258 |
| 2006/0250180 A1* | 11/2006 | Hughes | H03F 3/45991 327/551 |
| 2006/0255783 A1* | 11/2006 | Chapuis | G01R 19/0092 323/282 |
| 2012/0007680 A1 | 1/2012 | Hijikata et al. | |
| 2013/0129117 A1* | 5/2013 | Thomsen | H04R 3/00 381/111 |

(Continued)

*Primary Examiner* — Don N Vo
(74) *Attorney, Agent, or Firm* — Sheridan Ross P.C.

(57) ABSTRACT

An amplifier, a circuit, and an optical communication system are provided. The disclosed amplifier may include a single-to-differential variable gain amplifier having a variable resistor switch that substantially always operates in a triode region at all time. Said another way, the resistor switch is configured to operate in a triode region regardless of whether or not a first portion of an input signal to the variable gain amplifier is larger than a second portion of the input signal. The disclosed scheme helps to keep the variable resistor switch in the triode region in all cases of operation, thereby maintaining the linearity condition and reducing distortion in the variable gain amplifier.

20 Claims, 10 Drawing Sheets

(56) References Cited

U.S. PATENT DOCUMENTS

2015/0097620 A1\* 4/2015 Adamski ............... H03F 3/2176
330/251

\* cited by examiner

LOW DISTORTION SINGLE-TO-DIFFERENTIAL WIDE-BAND VARIABLE GAIN AMPLIFIER FOR OPTICAL COMMUNICATIONS

FIELD OF THE DISCLOSURE

The present disclosure is generally directed toward amplifiers and their use in various types of systems such as optical communication systems.

BACKGROUND

To save power and increase data handling capacity per channel, optical data transmission systems have multiple single-ended receiver channels. Typically, the optical receiver channel has a wide-bandwidth linear single-to-differential radio frequency (RF) variable gain amplifier at its Analog Front-End (AFE). Hence, non-linearity is of greater importance because it leads to in-band distortion components. Moreover, modern optical data transmission systems using complex modulation schemes, such as PAM-4, require lower Differential Non-Linearity (DNL), which is the performance metric used to quantify the distortion in a data eye-diagram. Higher DNL creates a distorted data eye, which results in bit errors that are not acceptable in secured communication links.

BRIEF DESCRIPTION OF THE DRAWINGS

The present disclosure is described in conjunction with the appended figures, which are not necessarily drawn to scale.

DETAILED DESCRIPTION

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

Various aspects of the present disclosure will be described herein with reference to drawings that are schematic illustrations of idealized configurations. As such, variations from the shapes of the illustrations as a result, for example, circuit configurations, manufacturing techniques and/or tolerances, are to be expected. Thus, the various aspects of the present disclosure presented throughout this document should not be construed as limited to the particular circuit elements illustrated and described herein but are to include deviations in circuits and functionally-equivalent circuit components.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

Figure 1:
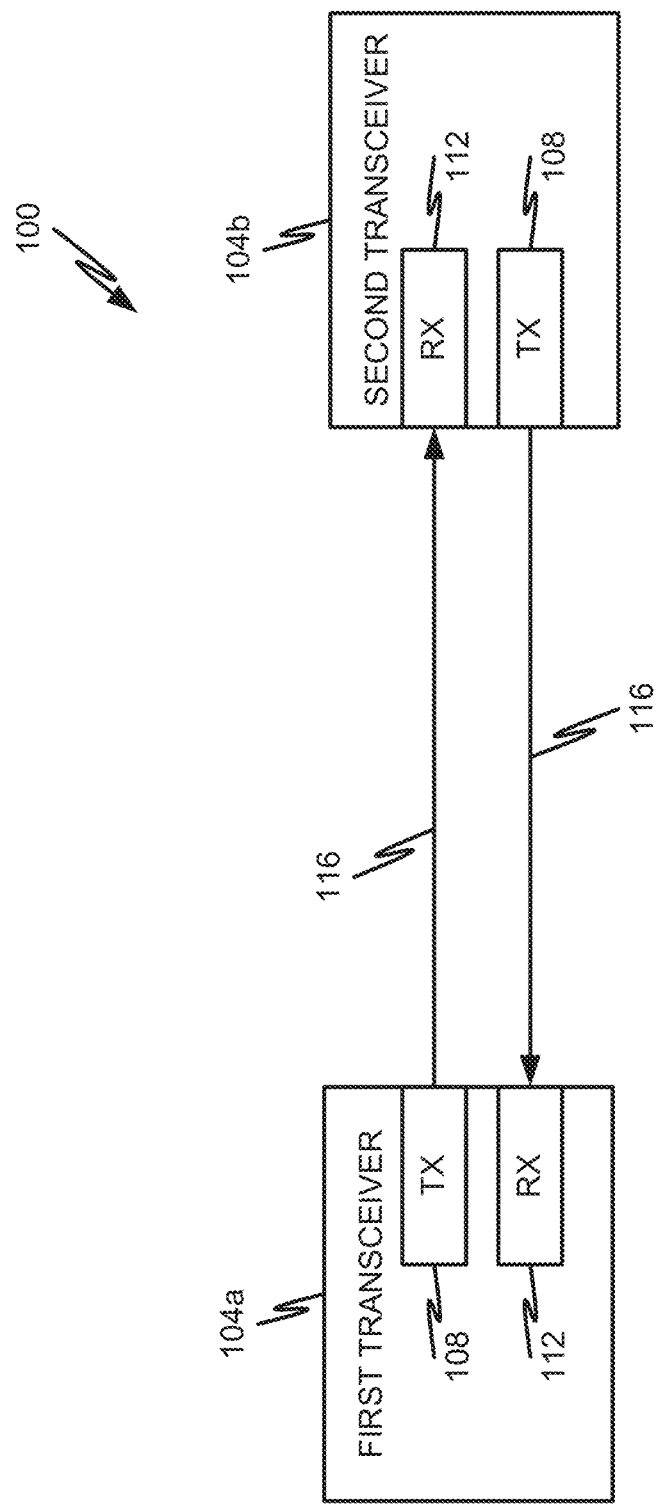
FIG. 1 is a block diagram depicting an optical communication system in accordance with at least some embodiments of the present disclosure.
Figure 2:
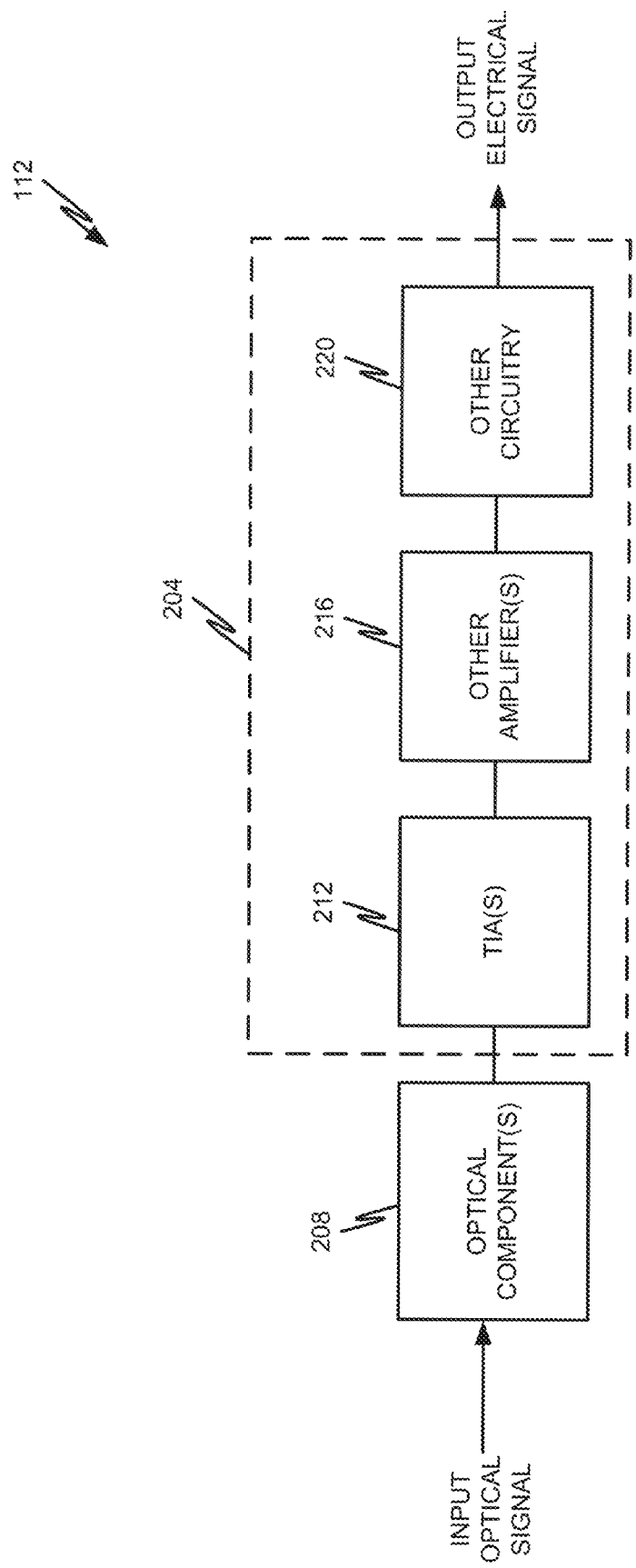
FIG. 2 is a block diagram depicting an optical receiver in accordance with at least some embodiments of the present disclosure.

With reference now to FIG. 1, an illustrative communication system 100 in which embodiments of the present disclosure may be utilized will be described. The system 100 is shown to include one or more transceivers 104a, 104b, each having a transmitter 108 and a receiver 112. The transceivers 104a, 104b are shown to communicate with one another via one or more communication channels 116 that connect a transmitter 108 with a receiver 112. It should be appreciated that embodiments of the present disclosure may also be implemented in a communication system having dedicated transmitters 108 and receivers 112 instead of a combination of a transmitter 108 and receiver 112 being implemented in a transceiver 104.

In a specific, but non-limiting example of the communication system, signals carried between the transmitter 108 and receiver 112 are transmitted at a relatively high bit rate (e.g., 10 Gbps, 25 Gbps, or greater) using a modulation technique that doubles the achievable data rate for a given link bandwidth. More specific types of modulation techniques that may be used in the communication system 100 include, without limitation, a Pulse Amplitude Modulation (PAM)-4 modulation scheme (or a QAM-16 or QAM-64 modulation scheme).

The receiver 112 is configured to receive an input optical signal and produce an output electrical signal using the combined functionality of the optical component(s) 208 and AFE 204. Although certain components are depicted as being included in the AFE 204, it should be appreciated that embodiments of the present disclosure are not limited to the depicted configuration of components.

Although embodiments of the present disclosure will be described in connection with circuitry for an optical communication system having a variable gain amplifier, it should be appreciated that embodiments of the present disclosure are not so limited. To the contrary, any circuit element exhibiting a behavior that can benefit from some type of distortion-improvement scheme disclosed herein could utilize embodiments of the present disclosure. Furthermore, embodiments of the present disclosure are not limited to communication systems or optoelectronic components of communication systems. Instead, embodiments of the present disclosure can be used in a wide variety of environments including computing applications, server applications, data centers, etc.

As will be discussed in further detail herein, an approach is presented which achieves a desired lower DNL (e.g., distortion) in a single to differential Variable Gain Amplifier (VGA) by keeping a variable NMOS resistor switch of the VGA in the triode operating region under high input signal levels. Conventionally bootstrapped N-type Metal-Oxide-Semiconductor (NMOS) switches are used in the track and hold circuits to make the charge-injection in the ON-OFF switches signal independent by keeping the gate-to-source voltage of the NMOS fixed. Embodiments of the present disclosure apply the bootstrapping concept to the variable NMOS resistor switch by adding a DC-blocking capacitor thereto. To make the bootstrapping scheme work in all cases, a high-speed half-wave rectifier is also introduced to the NMOS resistor. The half-wave rectifier plus the DC-Blocks capacitor(s) allow only the positive RF signal, thereby blocking both the common mode voltage and negative RF signal from reaching the gate of the NMOS switch. This helps to keep the NMOS switch in the triode region in all cases, thus maintaining the linearity condition and reducing distortion in the VGA.

The non-linearity in VGAs is often reduced using two techniques: (1) Negative Feedback or (2) Variable Gain Control. In negative feedback, a resistor is added in the emitter of the transistor, which causes the trans-conductance (Gm) of the transistor to be independent of the transistor non-linearity. Additionally in the case of amplifiers with large open loop gain the Gm of the amplifier becomes inversely proportional to the passive resistor which is inherently linear. However, adding an emitter resistor degenerate the intrinsic Gm of the transistor and reduces the closed loop system gain. Accordingly, to get higher gain, additional amplifier stages are required which result in more power consumption, reduced bandwidth, and potential instability.

In variable gain control, non-linearity is attributed to input signal strength. All transistors have a fixed input compression threshold. An input signal greater than this threshold results in a compressed or distorted signal at the amplifier output. This means that all linear systems try to regulate (or reduce) the amplifier gain for large input signals. Typically, in a single-to-differential optical receiver Analog front-end (AFE) application, a variable degeneration resistor is used to achieve higher linearity and to provide variable gain control. The variable degeneration resistor is implemented using a NMOS transistor switch, which is biased in the triode region. In the triode operating region, the NMOS channel resistance has a linear resistor like I-V characteristics. Additionally, the NMOS gate bias voltage can be controlled to modulate the channel providing a variable resistance. To operate the NMOS in the triode region, the gate voltage of the NMOS switch has to be a threshold voltage higher than its drain voltage (gate-to-drain voltage or Vgd>Vthrehold). If this condition is violated, the NMOS transistor gets out of the triode operating region and enters a saturation (or pinch-off) region where the channel resistance no longer has resistor-like linear characteristics. Hence, a VGA using a NMOS switch as a variable degeneration resistor can suffer from distortion when the NMOS switch operates or enters the saturation operating region.

Figure 3:
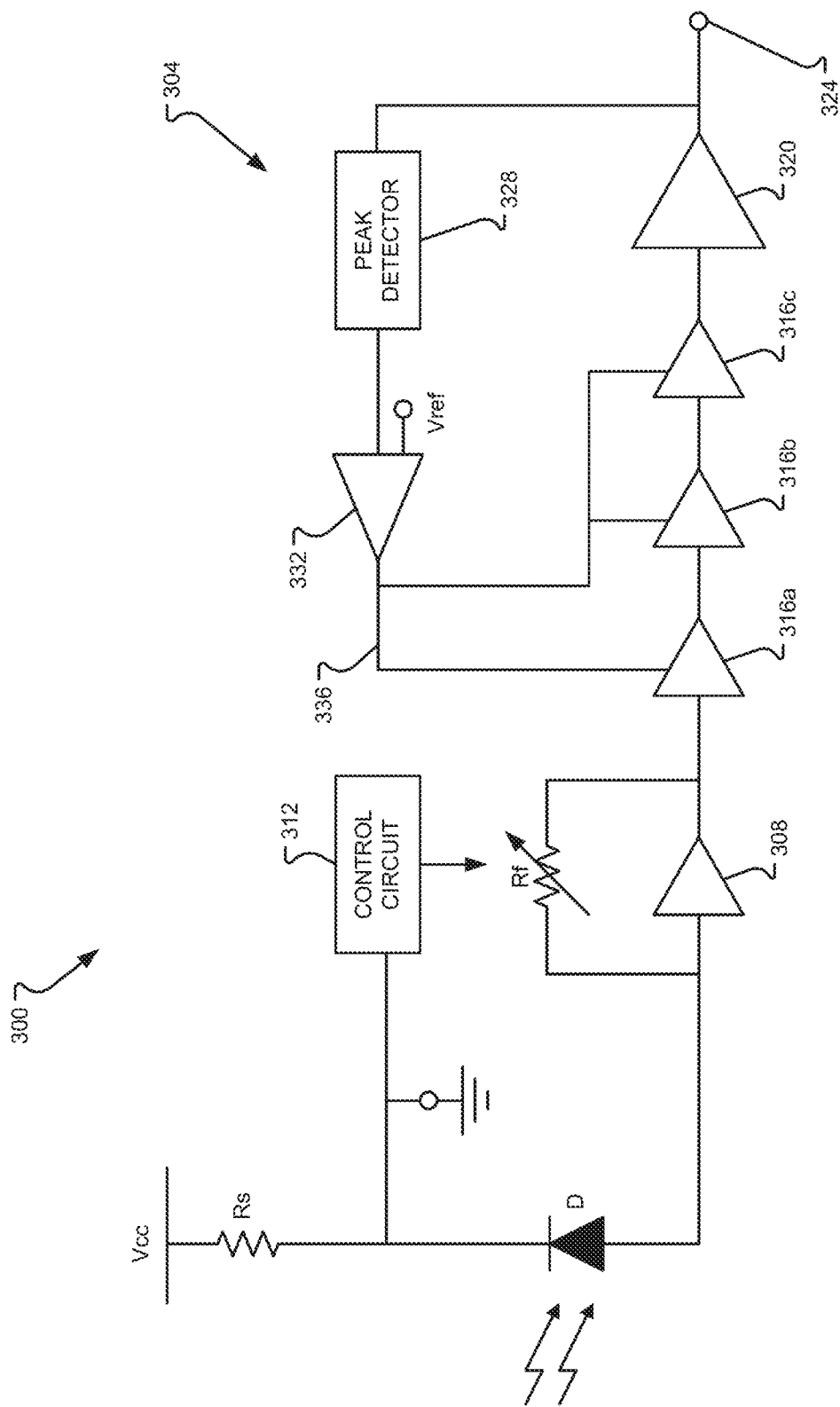
FIG. 3 is a circuit diagram depicting an illustrative receiver circuit in accordance with at least some embodiments of the present disclosure.

With reference now to FIG. 3, additional details of a circuit 300 which may be included as part of the AFE 204 will be described in accordance with at least some embodiments of the present disclosure. The circuit 300 is shown to include a photodiode D, a first amplifier 308, a plurality of second amplifiers 316a-c, an output driver 320, a gain control loop 304, an amplifier control circuit 312, and a circuit output 324. In this figure we have to add the VGA as one of the amplifier with the control circuits.

The photodiode D may correspond to one example of an optical component 208. The photodiode D may be biased by input voltage Vcc connected to the photodiode D through a supply resistor Rs.

The first amplifier 308 may correspond to an example of the TIA 212. In addition to including the amplifier itself, the TIA 212 may also include a feedback resistor Rf connected between an input and an output of the first amplifier 308. The feedback resistor Rf may include a static resistance or a controllable feedback network that is controlled by control circuit 312. In some embodiments, the control circuit 312 may comprise one or more control elements that adjust the feedback resistor Rf or other values of feedback components in the feedback loop of the first amplifier 308.

The output of the first amplifier 308 is provided to the series of second amplifiers 316a, 316b, 316c, which may correspond to examples of other amplifiers 216. In some embodiments, the amplifiers 316a-c comprise variable gain amplifiers that are each controlled with a gain control voltage 336 output by an integrator 332 and peak detector 328 in the gain control loop 304. Specifically, the variable gain amplifiers 316a-c may have their control voltage adjusted as the output signal 324 changes over time. The change in the control voltage 336 may be implemented by the peak detector 328 detecting peaks and/or valleys in the output signal 324 and then provided information about such detected peaks and valleys to the integrator 332. The integrator 332 may integrate the output of the peak detector 328 with a reference voltage Vref, which may correspond to a predetermined reference or threshold voltage. In other words, if the peak detector 328 detects peaks of the output signal 324 to exceed the reference voltage Vref, then the integrator 332 may adjust the control voltage 336, thereby altering the amount of gain applied by the variable gain amplifiers 316a-c.

Although FIG. 3 shows a series of three variable gain amplifiers, it should be appreciated that a greater or lesser number of variable gain amplifiers 316a-c can be incorporated into the circuit 300 without departing from the scope of the present disclosure. Furthermore, the configuration of variable gain amplifiers 316a-c may be the same or they may be different from one another without departing from the scope of the present disclosure.

The output driver 320 may correspond to an example of other circuitry 220. In some embodiments, the output driver 320 receives the output from the plurality of variable gain amplifiers 316a-c and produces the output signal 324. The output driver 320 may include a 50 ohm output driver having two pairs of differential transistors connected to one another in a known fashion.

Figure 4:
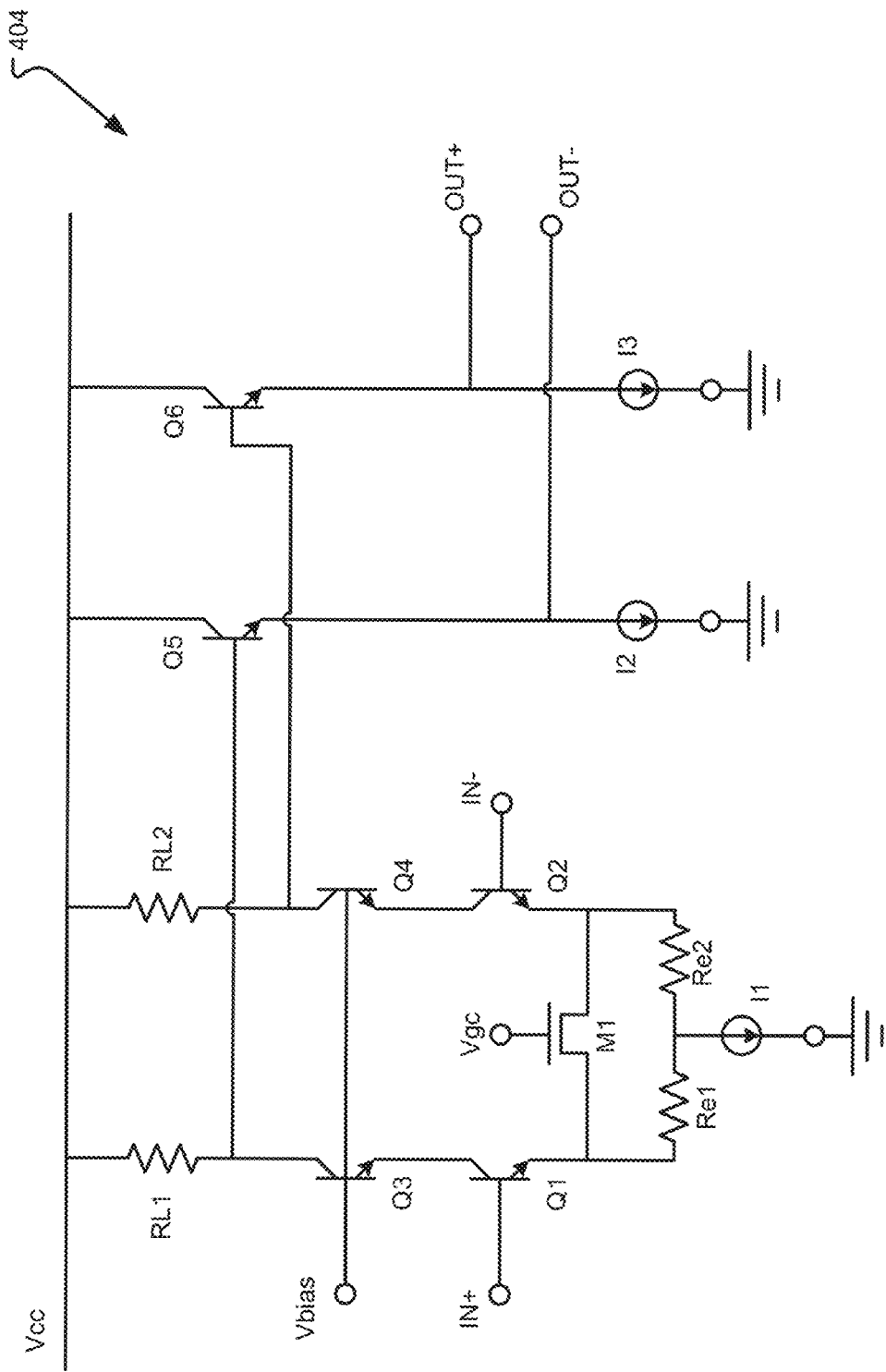
FIG. 4 is a circuit diagram depicting details of variable gain amplifier circuit in accordance with at least some embodiments of the present disclosure.

With reference now to FIG. 4, additional details of a variable gain amplifier circuit 400 will be described in accordance with at least some embodiments of the present disclosure. The variable gain amplifier circuit 400 may correspond to an example of the circuitry for any one of the variable gain amplifiers 316a-c. In some embodiments, each variable gain amplifier 316a-c may have the same circuit 400 configuration. In other embodiments, each variable gain amplifier may have slightly different circuitry or a configuration of circuit components.

The illustrative circuit 400 for a variable gain amplifier 316 is shown to include a first pair of differential transistors Q1, Q2 connected in series with a second pair of differential transistors Q3, Q4. The first pair of differential transistors Q1, Q2 may receive opposite input signals IN+, IN−, at their respective bases whereas the second pair of differential transistors Q3, Q4 may by controlled by a bias voltage Vbias at their bases. The collectors of the transistors Q3, Q4 is connected to the supply voltage VCC through load resistors RL1, RL2, respectively. The emitters of the transistors Q3, Q4 may be directly connected to the collectors of the transistors Q1, Q2. The emitters of the transistors Q1, Q2 may be connected to one another with a transistor M1 being controlled by the gain control voltage 336 or Vgc. The emitters of transistors Q1, Q2 are also provided as an output current I1 through resistors Re1, Re2, respectively.

In collectors of the transistors Q3, Q4 are further connected to bases of another pair of differential transistors Q5, Q6, whose collectors are connected directly to the control voltage Vcc. The emitters of the transistors Q5, Q6 are provided as a differential output OUT+, OUT−, respectively, in addition to driving output currents I2 and I3.

Figure 5:
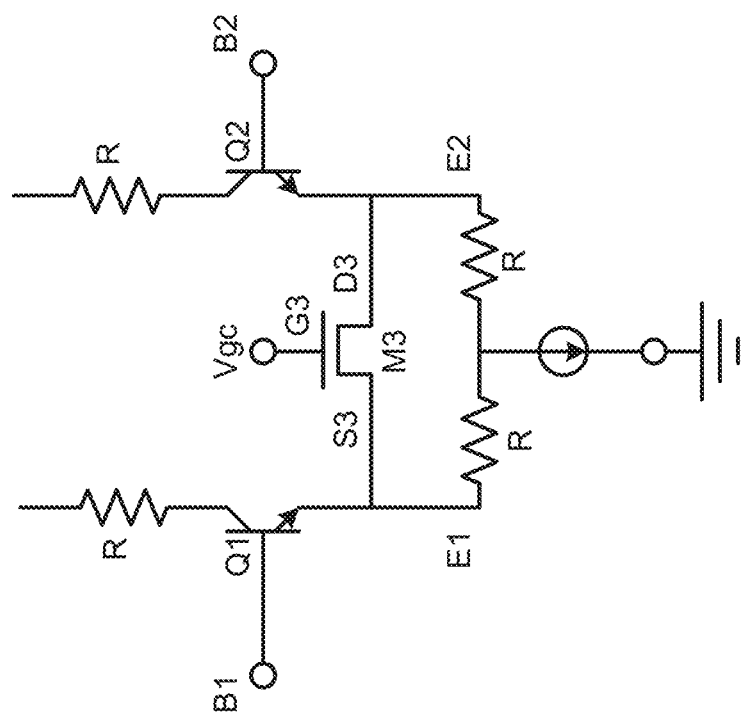
FIG. 5 is a circuit diagram further depicting details of a variable gain amplifier circuit in accordance with at least some embodiments of the present disclosure.

In some embodiments, the transistor M1 connected between the pair of differential transistors Q1, Q2 corresponds to a MOSFET transistor. In some situations, the transistor M1 can enter into a saturation region of operation, which can negatively impact the behavior of the variable gain amplifier's output. Specifically, as can be seen with reference to FIG. 5 which depicts additional details of the circuit 400, if the input base voltage VB1 of the first transistor Q1 is greater than the input base voltage VB2 of the second transistor Q2, then the voltage between the gate and the drain of the transistor M1 will be substantially equal to the following:

$$Vgd=Vgc-(Vcm+VB1-VBE1)$$

Where Vgc is the gain control voltage, where Vcm can be assumed to be equal to Vgc, where VB1 corresponds to the input base voltage B1 of the first transistor Q1, and where VBE1 is the base-to-emitter voltage of the first transistor Q1. In this scenario, when the input base voltage VB1 of the first transistor Q1 is greater than the input base voltage VB2 of the second transistor Q2, the transistor M1 can potentially enter the non-linear saturation region where it no longer maintains the linearity condition where its gate-to-drain voltage is greater than a threshold voltage Vth.

Conversely, when the input base voltage VB1 of the first transistor Q1 is lower than the input base voltage VB2 of the second transistor Q2, then the transistor's M1 source and drain polarity gets reversed and the linearity condition is reference to the emitter of the second transistor Q2. In this scenario, the transistor M1 will be operating in a triode region because the base of the second transistor Q2 is at a fixed common-mode voltage and the gate voltage at the transistor M1 is a threshold voltage Vth higher than its drain voltage.

Figure 6:
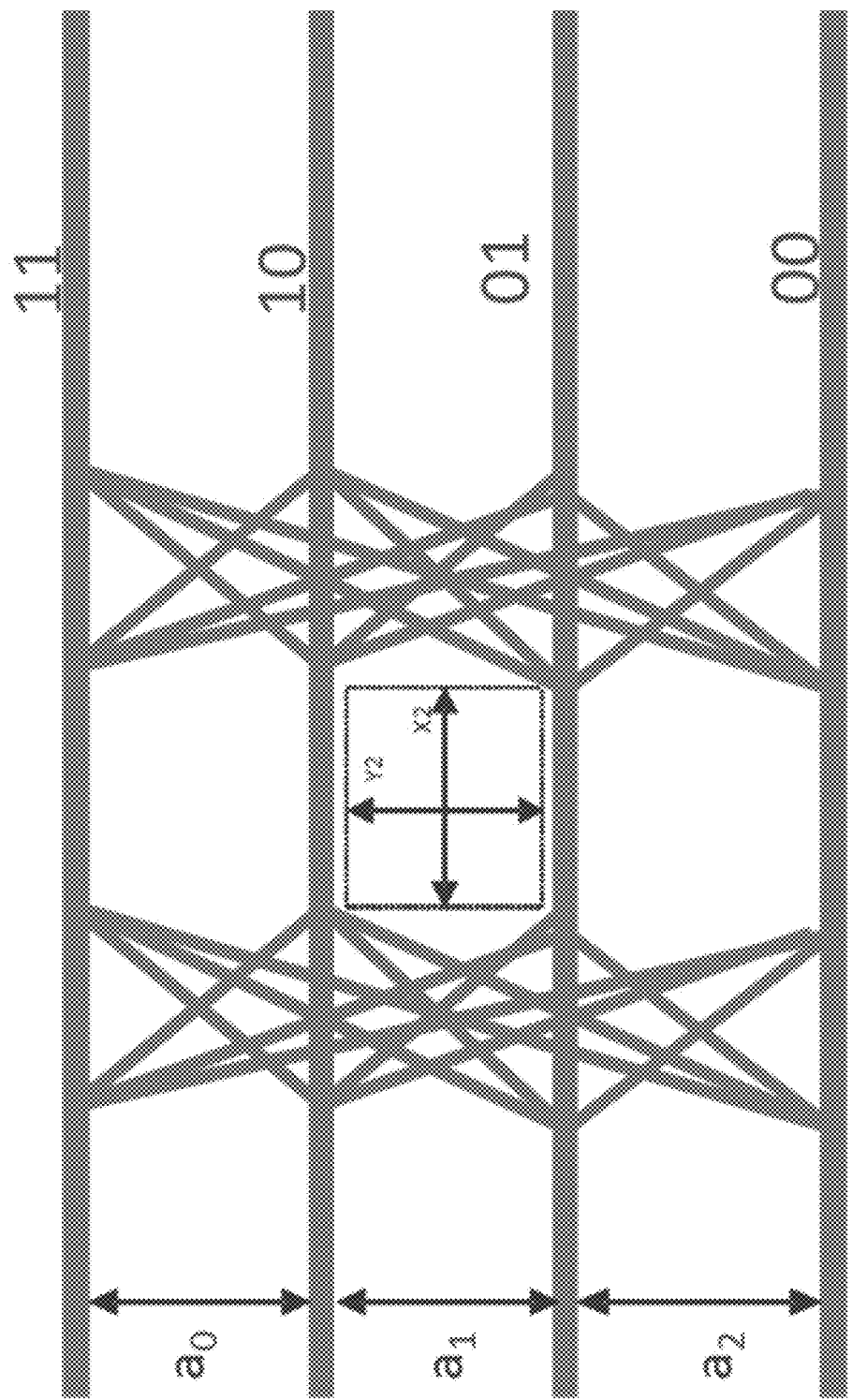
FIG. 6 is a data eye diagram depicting illustrative PAM-4 signaling with a defined maximum DNL in accordance with at least some embodiments of the present disclosure.

Because the first case (e.g., VB1>VB2) happens often when the input signal is strong or when the RF signal at the input of the variable gain amplifier is larger than the common-mode voltage, the non-linearity from the transistor M1 results in a higher distortion at the variable gain output. The performance metric used to measure the distortion in the variable gain amplifier is called the Differential Non-Linearity (DNL), which is the measure of the compression in the data eye-plot and is given in a percentage as shown in FIG. 6. In particular, FIG. 6 shows the PAM-4 signals and defines the maximum DNL in the PAM-4 case. Lower DNL is desired to reduce distortion in the variable gain amplifier. In FIG. 6, the switch of the data eye is x2 and the height of the data eye is y2. The distances (e.g., a0, a1, a2) between each level (e.g., 00, 01, 10, 11), can be used to characterize the maximum acceptable DNL, which can be determined according to the following:

$$DNLmax = \left(\frac{min(a0,a1,a2)}{(a0+a1+a2)} - 0.33\right) \times 100\%$$

Figure 7:
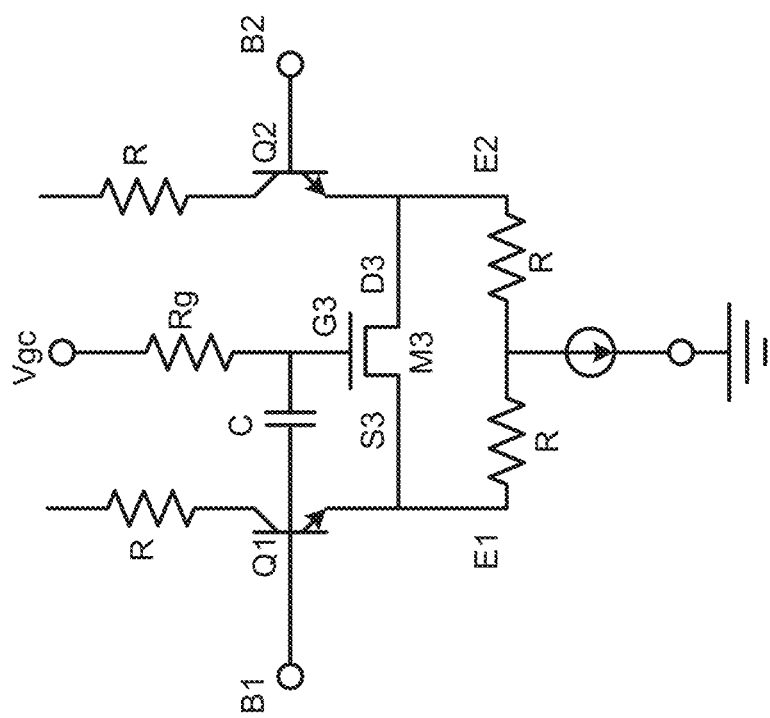
FIG. 7 is a circuit diagram depicting another variable gain amplifier circuit in accordance with at least some embodiments of the present disclosure.

Accordingly, embodiments of the present disclosure propose an architecture capable of achieving this desired lower DNL in a single-to-differential variable gain amplifier by keeping the transistor M1 in the triode region even under high input signal levels. In particular, FIG. 7 depicts an illustrative circuit configuration for the variable gain amplifier 316 where a DC-blocking capacitor C is added between the base of the first transistor Q1 and the gate of the transistor M1. The DC-blocking capacitor C facilitates a boot-strapping concept to block the common-mode bias voltage on the first transistor Q1 from reaching the gate voltage on the transistor M1. The DC-blocking capacitor C also enables the gate of the transistor M1 to track the input RF signal maintaining the transistor M1 in the triode region and satisfying the linearity condition. Lastly, the NMOS resistance (e.g., the combined resistance of the resistors R after application of a control signal by the transistor M1) can be controlled with an independent bias voltage on the gate of the transistor M1 (e.g., the gain control voltage Vgc).

Accordingly, with the addition of the DC-blocking capacitor C, the transistor M1 remains in the triode region when the input base voltage VB1 of the first transistor Q1 is greater than the input base voltage VB2 of the second transistor Q2. However, when the input base voltage VB1 of the first transistor Q1 is lower than the input base voltage VB2 of the second transistor Q2, the transistor's M1 source and drain polarity gets reversed, but unlike the case in FIGS. 4 and 5, the transistor M1 can potentially enter into saturation.

Figure 8:
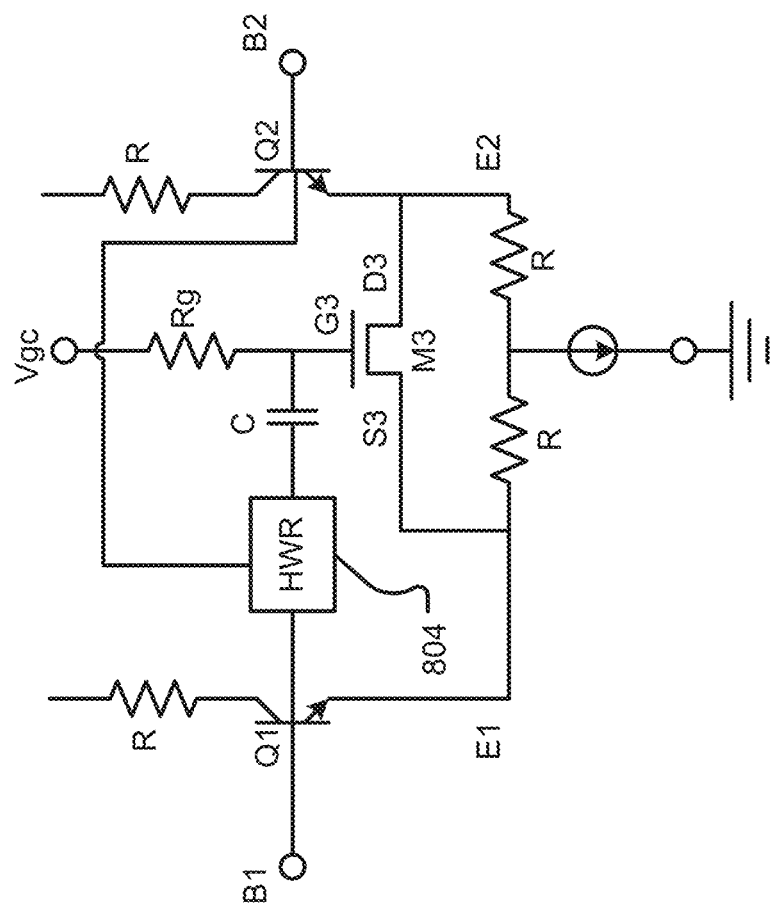
FIG. 8 is a circuit diagram depicting another variable gain amplifier circuit in accordance with at least some embodiments of the present disclosure.

To make the boot-strapping scheme work in both cases (e.g., where VB1>VB2 and where VB1<VB2), a half-wave rectifier 804 is introduced between the DC-blocking capacitor C and the base of the first transistor Q1 as shown in FIG. 8. The half-wave rectifier 804 plus the DC-blocking capacitor C allows only the positive RF signal, blocking both the common mode voltage and the negative RF signal from reaching the gate of the transistor M1.

Figure 9:
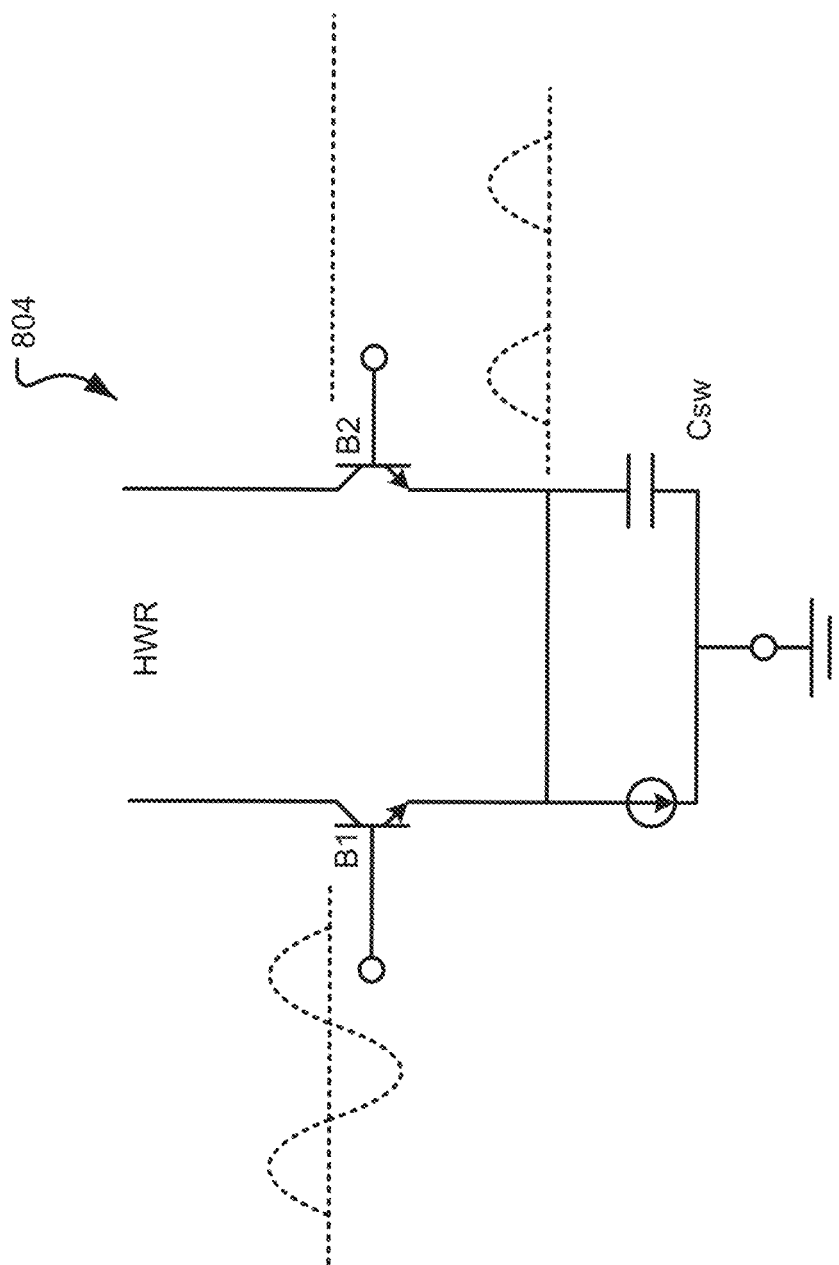
FIG. 9 is a circuit diagram operation of a half-wave rectifier in accordance with at least some embodiments of the present disclosure.
Figure 10:
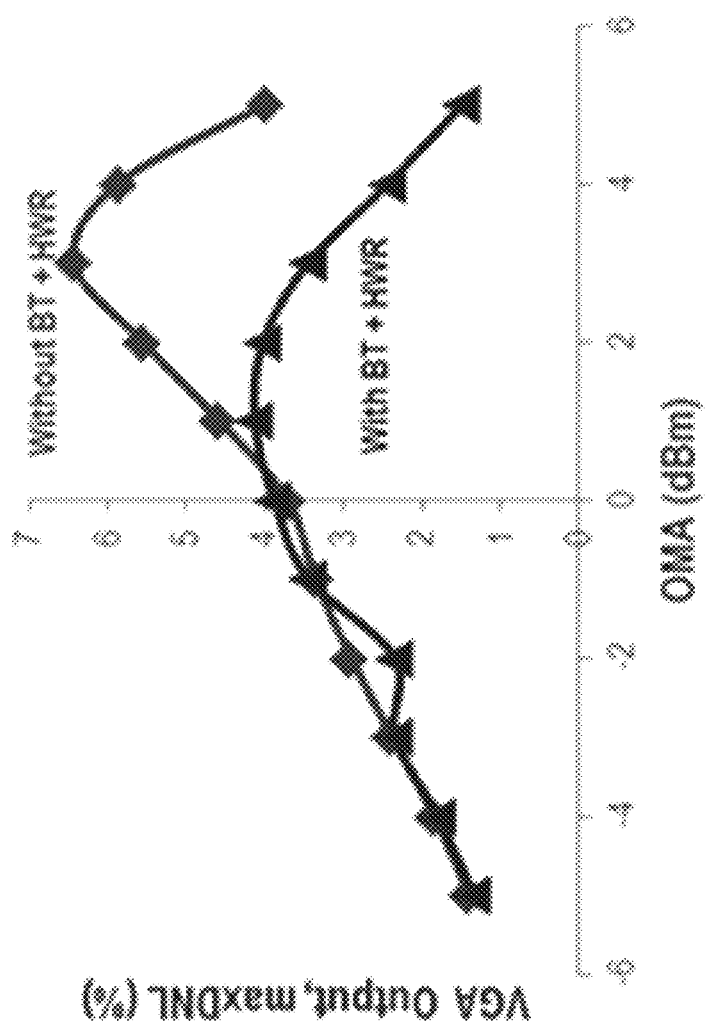
FIG. 10 is a plot of maximum DNL measured at an output of a variable gain amplifier as a function of optical modulation amplitude with and without bootstrapping (BT) and use of a half-wave rectifier in accordance with at least some embodiments of the present disclosure.

FIG. 9 depicts an illustrative construction of the half-wave rectifier 804 and FIG. 10 depicts a plot of the maximum DNL measured as the output of a variable gain amplifier 316 as a function of the Optical Modulation Amplitude (OMA) with and without the boot-strapping and the half-wave rectifier 804. As can be seen in FIG. 10, if the DC-blocking capacitor C and half-wave rectifier 804 are not used, then the maximum DNL can exceed values of 6% or more, which can lead to an intolerable amount of signal distortion. However, with the utilization of boot-strapping with the DC-blocking capacitor C and the half-wave rectifier 804, the maximum DNL is maintained below a threshold value of 4%.

The DNL at input OMA levels between 0 and 3 dbm has dropped from 6% to 3% by using the proposed boot-strapping and half-wave rectifier scheme. With a lower DNL and reduced non-linearity, an optical receiver such as a PAM-4 receiver implemented with this solution has less distortion at its output. Accordingly, higher PAM modulation schemes such as PAM-8 with multiple voltage levels can now be supported as the signal suffers from less compression.

Specific details were given in the description to provide a thorough understanding of the embodiments. However, it will be understood by one of ordinary skill in the art that the embodiments may be practiced without these specific details. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. An amplifier, comprising:
   a first switch receiving a first portion of an input signal received at the amplifier;
   a second switch receiving a second portion of the input signal;
   an N-type Metal-Oxide-Semiconductor (NMOS) resistor switch connected between the first and second switches, wherein the NMOS resistor switch is configured to operate in a triode region regardless of whether or not the first portion of the input signal is larger than the second portion of the input signal; and
   a Direct Current (DC)-blocking capacitor connected between a base of the first switch and a gate of the NMOS resistor switch that blocks a common-mode bias voltage on the first switch from reaching a gate voltage of the NMOS resistor switch.

2. The amplifier of claim 1, wherein the first switch comprises a first transistor having the base, a collector, and an emitter and wherein the second switch comprises a second transistor having a base, a collector, and an emitter.

3. The amplifier of claim 2, wherein the DC-blocking capacitor causes the gate of the NMOS resistor switch to track the input signal by maintaining the NMOS resistor switch in the triode region.

4. The amplifier of claim 3, wherein the half-wave rectifier along with the DC-blocking capacitor allow only a positive signal blocking in both a common mode voltage and a negative signal from reaching the gate of the NMOS resistor switch.

5. The amplifier of claim 2, further comprising:
   a half-wave rectifier connected between the DC-blocking capacitor and the base of the first transistor.

6. The amplifier of claim 2, wherein the DC-blocking capacitor causes the NMOS resistor switch to remain in the triode region when a base voltage of the first transistor is greater than a base voltage of the second transistor.

7. The amplifier of claim 1, wherein the NMOS resistor switch is connected across a pair of resistors that connect an emitter of the first switch with an emitter of the second switch.

8. The amplifier of claim 1, wherein the input signal comprises a Pulse Amplitude Modulated (PAM) signal.

9. The amplifier of claim 1, wherein the input signal is received from a photodiode.

10. The amplifier of claim 1, wherein the input signal is transmitted using a modulation technique that doubles an achievable data rate for a given link bandwidth.

11. The amplifier of claim 1, wherein an NMOS resistance is controlled by an independent bias voltage on the gate of the NMOS resistor switch.

12. The amplifier of claim 1, wherein a maximum distortion in the amplifier is maintained below a threshold value of four percent.

13. A circuit, comprising:
    a photodiode configured to receive an optical signal and convert the optical signal into an electrical signal; and
    one or more variable gain amplifiers configured to receive the electrical signal or a variant thereof and amplify the received electrical signal or the variant thereof, wherein each of the one or more variable gain amplifiers comprise:
    a first transistor;
    a second transistor; and
    an N-type Metal-Oxide-Semiconductor (NMOS) resistor switch connected between the first and second transistors, wherein the NMOS resistor switch is configured to operate in a triode region when an input voltage at a base of the first switch is greater than an input voltage at a base of the second switch, wherein the NMOS resistor switch is also configured to operate in the triode region when the input voltage at the base of the first switch is less than the input voltage at the base of the second switch, and wherein at least one of the one or more variable gain amplifiers comprise a Direct Current (DC)-blocking capacitor connected between a base of the first transistor and a gate of the NMOS resistor switch thereby blocking a common-mode bias voltage on the first switch from reaching a gate voltage of the NMOS resistor switch.

14. The circuit of claim 13, wherein the DC-blocking capacitor causes the gate of the NMOS resistor switch to track the electrical signal received at the one or more variable gain amplifiers by maintaining the NMOS resistor switch in the triode region.

15. The circuit of claim 13, wherein the at least one of the one or more variable gain amplifiers further comprises a half-wave rectifier.

16. The circuit of claim 15, wherein the half-wave rectifier is connected between the DC-blocking capacitor and the base of the first transistor.

17. The circuit of claim 16, wherein the half-wave rectifier along with the DC-blocking capacitor allow only a positive signal blocking in both a common mode voltage and a negative signal from reaching the gate of the NMOS resistor switch.

18. The circuit of claim 17, wherein the DC-blocking capacitor causes the NMOS resistor switch to remain in the triode region when a base voltage of the first transistor is greater than a base voltage of the second transistor.

19. An optical communication system, comprising:
    an analog front end comprising one or more variable gain amplifiers, the one or more variable gain amplifiers comprising:
    a first transistor;
    a second transistor; and
    an N-type Metal-Oxide-Semiconductor (NMOS) resistor switch connected between the first and second transistors, wherein the NMOS resistor switch is configured to operate in a triode region when an input voltage at a base of the first switch is greater than an input voltage at a base of the second switch, wherein the NMOS resistor switch is also configured to operate in the triode region when the input voltage at the base of the first switch is less than the input voltage at the base of the second switch, and wherein at least one of the one or more variable gain amplifiers comprise a Direct Current (DC)-blocking capacitor connected between a base of the first transistor and a gate of the NMOS resistor switch thereby blocking a common-mode bias voltage on the first switch from reaching a gate voltage of the NMOS resistor switch.

20. The optical communication system of claim 19, wherein the at least one of the one or more variable gain amplifiers further comprises a half-wave rectifier connected between the DC-blocking capacitor and the base of the first transistor.

* * * * *